(12) United States Patent
Kim et al.

(10) Patent No.: US 11,800,775 B2
(45) Date of Patent: Oct. 24, 2023

(54) DISPLAY DEVICE

(71) Applicant: SAMSUNG ELECTRONICS CO., LTD., Suwon-si (KR)

(72) Inventors: Won Seok Kim, Seongnam-si (KR); Si Woo Kim, Suwon-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 17/895,296

(22) Filed: Aug. 25, 2022

(65) Prior Publication Data
US 2023/0180575 A1 Jun. 8, 2023

(30) Foreign Application Priority Data
Dec. 3, 2021 (KR) .................. 10-2021-0172059

(51) Int. Cl.
*H01L 27/32* (2006.01)
*H10K 59/50* (2023.01)
*G02F 1/1368* (2006.01)
*G02F 1/1362* (2006.01)
*G02F 1/133* (2006.01)
*G09G 3/3225* (2016.01)
*G09G 3/36* (2006.01)
(Continued)

(52) U.S. Cl.
CPC .......... *H10K 59/50* (2023.02); *G02F 1/1368* (2013.01); *G02F 1/13306* (2013.01); *G02F 1/136286* (2013.01); *G09G 3/3225* (2013.01); *G09G 3/3648* (2013.01); *G02F 2201/44* (2013.01); *G02F 2203/01* (2013.01); *G09G 2300/02* (2013.01); *H10K 59/12* (2023.02); *H10K 59/35* (2023.02)

(58) Field of Classification Search
CPC ............ H01L 27/3232; H01L 27/3241; H01L 27/3244; H01L 27/3211; G02F 1/13306; G02F 1/136286; G02F 1/1368; G02F 2201/44; G02F 2203/01; G02F 2203/02; G02F 1/133377; G09G 3/3225; G09G 3/3648; H10K 59/50; H10K 59/35; H10K 59/12; H10K 50/8426; H10K 50/86; H10K 59/121; H10K 59/122; H10K 50/81; H10K 71/00; H10K 59/128; H10K 2102/103; H10K 2102/101; H10K 2102/00; H10K 59/1201
See application file for complete search history.

(56) References Cited

U.S. PATENT DOCUMENTS

2007/0057881 A1* 3/2007 Yu ........................... G02F 1/133
345/82
2007/0147077 A1 6/2007 Wang et al.
(Continued)

FOREIGN PATENT DOCUMENTS

JP 2007525706 A 9/2007
KR 20050042812 A 5/2005
(Continued)

*Primary Examiner* — Hoan C Nguyen
(74) *Attorney, Agent, or Firm* — Fish & Richardson P.C.

(57) ABSTRACT

A display device includes; pixel units arranged in a matrix on a first substrate, wherein each pixel unit among the pixel units includes a transmission region including a liquid crystal layer, and a reflection region spaced apart from the transmission region and including an organic light emitting layer.

18 Claims, 22 Drawing Sheets

(51) Int. Cl.
*H10K 59/12* (2023.01)
*H10K 59/35* (2023.01)

(56) References Cited

U.S. PATENT DOCUMENTS

| | | | | |
|---|---|---|---|---|
| 2012/0293428 A1* | 11/2012 | Yan | ................ | H01L 27/3267 |
| | | | | 345/173 |
| 2015/0014650 A1* | 1/2015 | Lim | ................ | H01L 51/5281 |
| | | | | 257/40 |
| 2016/0197131 A1* | 7/2016 | Park | ............ | H01L 51/56 |
| | | | | 438/23 |
| 2018/0053475 A1* | 2/2018 | Takahashi | ............ | G09G 3/3607 |
| 2018/0190735 A1* | 7/2018 | Son | ............ | G02F 1/133512 |

FOREIGN PATENT DOCUMENTS

| | | | |
|---|---|---|---|
| KR | 20090015320 A | | 2/2009 |
| KR | 101861309 B1 | * | 5/2018 |
| KR | 20180120025 A | * | 11/2018 |

* cited by examiner

DISPLAY DEVICE

This application claims priority under 35 U.S.C. 119 to Korean Patent Application No. 10-2021-0172059 filed on Dec. 3, 2021 in the Korean Intellectual Property Office, the subject matter of which is hereby herein incorporated by reference in its entirety.

BACKGROUND

1. Technical Field

The inventive concept relates generally to display devices.

2. Description of the Related Art

Display devices are commonly used (e.g., in televisions, signage, monitors, notebook personal computers (PCs), tablet PCs, smart phones, etc.), to visually display images corresponding to information. For example, contemporary display devices include various flat panel displays, such as liquid crystal display (LCD) panels and organic light emitting display (OLED) panels.

However, conventional LCD panels can be difficult to see in bright ambient environments.

SUMMARY

Embodiments of the inventive concept provide display devices able to more flexibly respond to a variety of ambient environments.

According to an embodiment of the inventive concept, a display device may includes; a first substrate, and pixel units arranged in a matrix on the first substrate, wherein each pixel unit among the pixel units includes a transmission region including a liquid crystal layer, and a reflection region spaced apart from the transmission region and including an organic light emitting layer.

According to an embodiment of the inventive concept, a display system may include; a display panel including pixel units disposed on a first substrate, and a driving circuit providing a driving signal to the display panel, wherein each pixel unit among the pixel units includes a transmission region including a liquid crystal layer, and a reflection region, spaced apart from the transmission region, and including an organic light emitting layer.

According to an embodiment of the inventive concept, a display system may include; a display panel including a substrate and pixel units disposed on the substrate, and a display driving circuit providing at least one driving signal to the pixel units. Each pixel unit among the pixel units may include; a first display unit including a liquid crystal layer, and a second display unit, spaced apart form the first display unit, and including an organic light emitting layer and a first electrode, wherein the first electrode does not extend into the first display unit.

BRIEF DESCRIPTION OF THE DRAWINGS

Advantages, benefits and features, as well as the making and use of the inventive concept will be better understood upon consideration of the following detailed description, together with the accompanying drawings, in which.

DETAILED DESCRIPTION

Throughout the written description and drawings, like reference numbers and labels are used to denote like or similar elements, components, features and/or method steps.

Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

Figure 1:
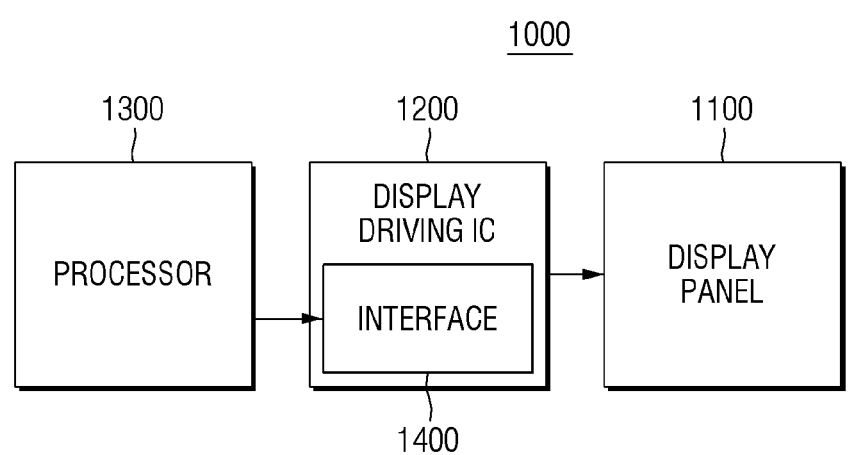
FIG. 1 is a block diagram of a display system including a display device according to embodiments of the inventive concept.
Figure 2:
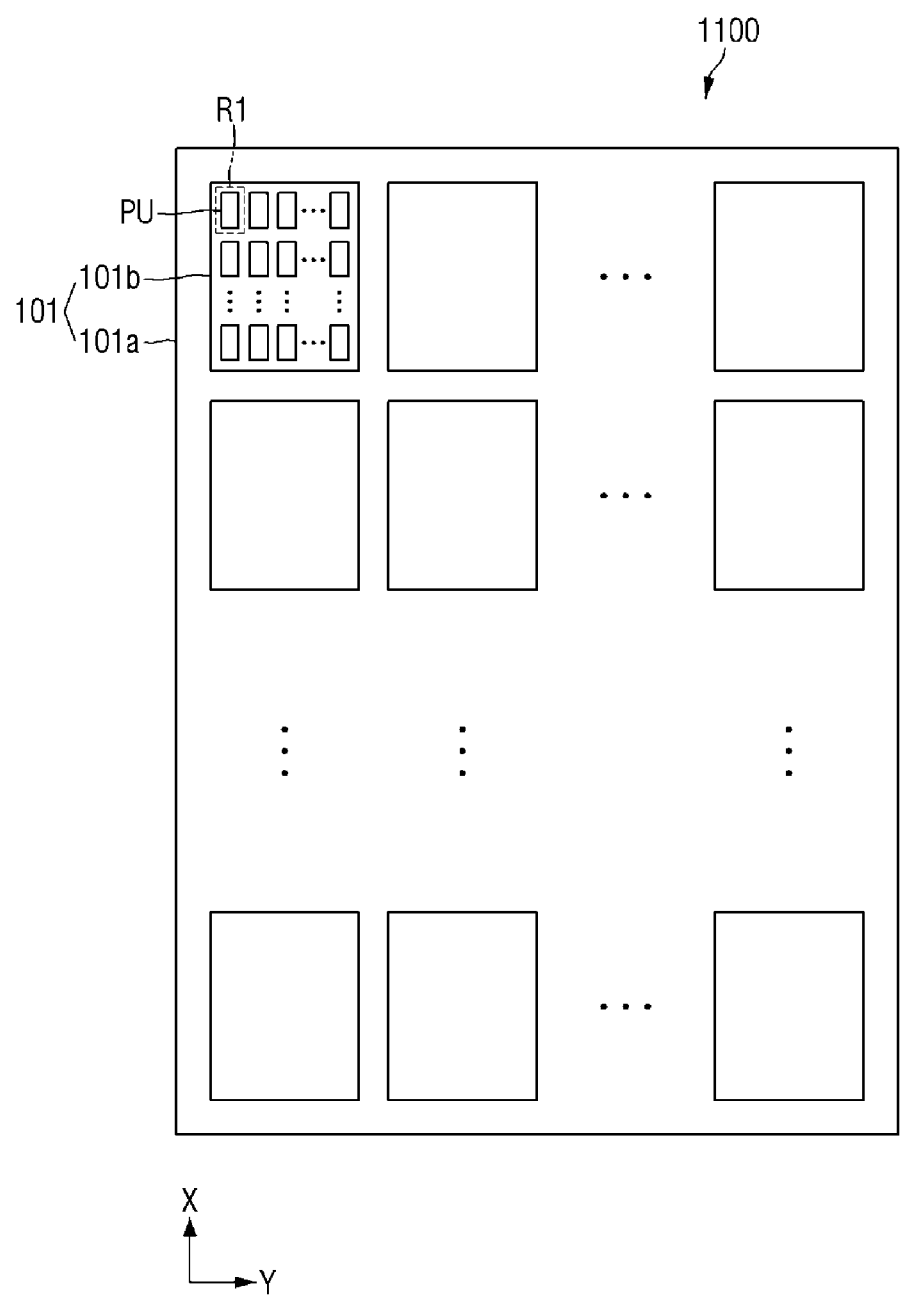
FIG. 2 is a plan (or top-down) diagram further illustrating in one example the display device of FIG. 1.
Figure 3:
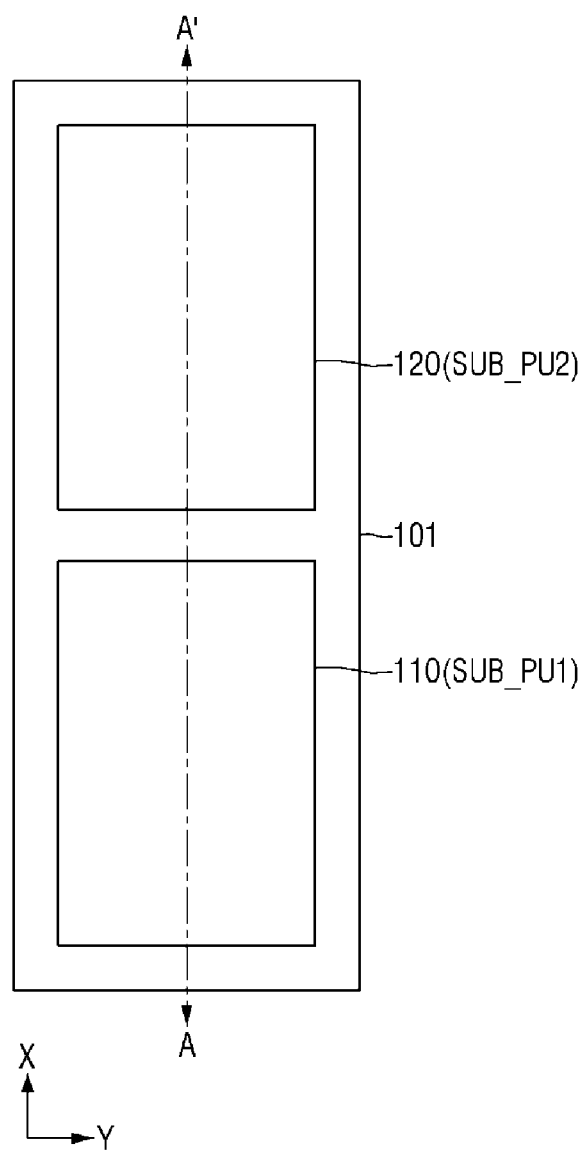
FIG. 3 is an enlarged view of region 'R1' indicated in FIG. 2.
Figure 4:
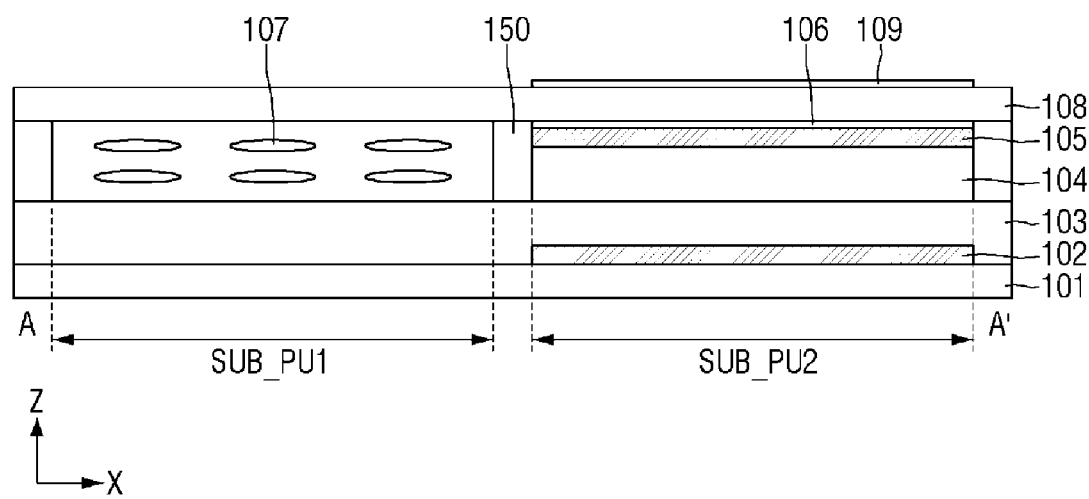
FIG. 4 is a cross-sectional view taken along line A-A' of FIG. 3 and related to an embodiment of the inventive concept.

Figure (FIG. 1 is a block diagram of a display system 1000 including a display device (e.g. a panel) 1100 according to embodiments of the inventive concept, FIG. 2 is a plan diagram further illustrating in one example the display device 1100 of FIG. 1, FIG. 3 is an enlarged view of region 'R1' indicated in FIG. 2, and FIG. 4 is a cross-sectional view taken along line A-A' of FIG. 3.

Referring to FIGS. 1, 2, 3, and 4, the display system 1000 may include the display device 1100, a display driving circuit 1200, and a processor 1300, wherein the display driving circuit 1200 may be connected to the processor 1300 through an interface 1400.

Here, the processor 1300 may include, but is not limited to, a Central Processor Unit (CPU), an Application Processor (AP), a Graphic Processing Unit (GPU).

The interface 1400 may be configured to operate in relation to one or more conventionally-understood and commercially-available data communications protocols defined in accordance with one or more standards promulgated by the Mobile Industry Processor Interface (MIPI) alliance (e.g., the MIPI D-PHY standard), Small Computer System Interface (SCSI), Peripheral Component Interface (PCI) express, Advanced Technology Attachment (ATA), Parallel ATA (PATA), Serial ATA (SATA), Serial Attached SCSI (SAS), and/or Non Volatile Memory express (NVMe).

In some embodiments, the display device 1100 may include an LCD display and an OLED display.

Referring to FIG. 2, the display device (e.g., a panel) 1100 may include a first substrate 101, and a number of pixel units (PU).

The first substrate 101 (e.g., a Chip on Film (COF) or a Chip on Plastic (COP) may be connected in a pad region PR to attach the display driving circuit 1200. That is, the first substrate 101 may electrically connect the pad region PR and the display driving circuit 1200. The display device 1100 may extend over the first substrate 101. Thus, the first substrate may serve as a substrate foundation for the display device 1100.

In some embodiments, the first substrate 101 may include a base substrate 101*a* (e.g., a glass substrate) and a panel substrate 101*b*. In this regard, multiple panel substrates 101*b* may be formed on the base substrate 101*a*. Accordingly, assuming that the base substrate 101*a* is a glass substrate and includes multiple panel substrates 101*b*, the bases substrate 101*a* may be as a mother glass.

Each of the panel substrates 101*b* may be formed from a transparent material, such as plastic, however the inventive concept is not limited thereto.

Referring to FIGS. 2, 3 and 4, pixel units PU may be disposed on the first substrate 101, or rather on the panel substrate 101*b*, in an array of row(s) and column(s), wherein each pixel unit PU may include a first display unit 110 (i.e., a first sub-pixel unit SUB_PU1) including a liquid crystal layer 107, and a second display unit 120 (i.e., a second sub-pixel unit SUB_PU2) including an organic light emitting layer 104.

The first display unit 110 and the second display unit 120 may be separated (or spaced apart) in a first horizontal direction (e.g., or 'X' direction as indicated in FIGS. 2 and 3) on an upper surface of the first substrate 101. In some embodiments, the first display unit 110 may be referred to as a transmission region, and the second display unit 120 may be referred to as a reflection region.

Referring to FIG. 4, a reflector 102 may be disposed between the first substrate 101 of the second display unit 120 (SUB_PU2) and the organic light emitting layer 104. That is, the reflector 102 may be disposed between the first substrate 101 and a backplane 103 of the second display unit 120. The reflector 102 does not extend between the first substrate 101 (SUB_PU1) and the first display unit 110. Here, the reflector 102 may be referred to as a first electrode and may function as a cathode. Thus, the reflector 102 may include at least one conductive material (e.g., one or more metal(s)).

The backplane 103 may extend across the first substrate 101 and be disposed between the first substrate 101 and the first display unit 110 and the second display unit 120. For example, the backplane 103 may be integrally formed with the first display unit 110 and the second display unit 120. However, the backplane 103 may be formed on the reflector 102 of the second display unit 120.

Thus, the backplane 103 may contact an upper surface of the first substrate 101, a lower surface of the first display unit 110, and an upper surface of the reflector 102 on the second display unit 120, such that the reflector 102 is interposed between the backplane 103 of the second display unit 120 and the first substrate 101.

In some embodiments, the backplane 103 may include a thin film transistor substrate and/or a thin film transistor wiring layer. Here, the thin film transistor substrate may include glass, and the thin film transistor wiring layer may include a conductive material, however the inventive concept is not limited thereto.

A partition wall 150 may be disposed between the first display unit 110 and the second display unit 120. That is, the partition wall 150 may serve, in part, to define a lateral separation boundary between the first sub-pixel unit SUB_PU1 and the second sub-pixel unit SUB_PU2, or between the first display unit 110 and the second display unit 120. In this regard, the partition wall 150 creates a separation boundary within the pixel unit PU defining the first sub-pixel unit SUB_PU1 and the second sub-pixel unit SUB_PU2.

The partition wall 150 may include at least one insulating material, such as polyimide, however the inventive concept is not limited thereto.

The organic light emitting layer 104 may be formed in the second sub-pixel unit SUB_PU2. Here, the organic light emitting layer 104 may be a region including a light emitting element (e.g., a red light emitting element, a green light emitting element or a blue light emitting element).

A second electrode 105 may be disposed on the organic light emitting layer 104, such that the organic light emitting layer 104 is disposed between the reflector 102 and the second electrode 105. In this case, when an appropriate voltage is applied, electrons and/or holes may be injected into the organic light emitting layer 104 from the reflector 102 and the second electrode 105.

In this regard, the second electrode 105 may function as an anode, and may include one or more conductive materials (such as one or more metal(s)). In some embodiments, the second electrode 105 may include a transparent material, however the inventive concept is not limited thereto.

A sealing layer 106 may be disposed on the second electrode 105, and may include a thin film encapsulation layer (e.g., an inorganic film and/or an organic film). Thus, in some embodiments, the sealing layer 106 may be a multilayer film including inorganic film(s) and/or organic film(s), however the inventive concept is not limited thereto.

The liquid crystal layer 107 may be formed in the first sub-pixel unit SUB_PU1 of the first display unit 110. That is, the liquid crystal layer 107 may be disposed on a portion of the backplane 103 extending under the first display unit 110.

A second substrate 108 may be disposed on the first substrate 101 to cover the first display unit 110 and the second display unit 120. That is, the second substrate 108 may be disposed on the upper surface of the liquid crystal layer 107, the upper surface of the sealing layer 106, and the upper surface of the partition wall 150.

In some embodiments, the second substrate 108 may include one or more insulating material(s), such as plastic. Further, the second substrate 108 may include a transparent material, however the inventive concept is not limited thereto.

A polarizing film 109 may be disposed on a portion of an upper surface of the second substrate 108 overlaying the second display unit 120. In this manner, the polarizing film 109 may form an upper portion of the second sub-pixel unit SUB_PU2.

FIGS. 5 to 12 are related cross-sectional views illustrating a method of manufacture for the display device of FIG. 4.

Figure 5:
FIGS. 5, 6, 7, 8, 9, 10, 11, and 12 (hereafter collectively, "FIGS. 5 to 12") are related cross-sectional views illustrating in one example a method of manufacture for the display device of FIG. 4.

Referring to FIG. 5, the reflector 102 may be formed on the first substrate 101 of the second display unit 120. The reflector 102 is disposed only in the second display unit 120, and does not extend into the first display unit 110. The reflector 102 may function as a first electrode (or a cathode).

Figure 6:
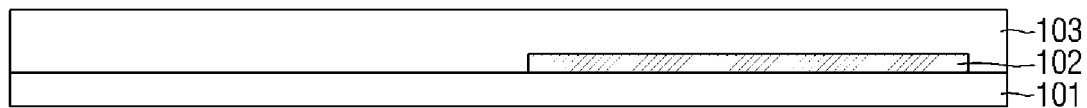

Referring to FIG. 6, the backplane 103 may be formed on the first substrate 101 and the reflector 102. The backplane 103 may be integrally formed in the first display unit 110 and the second display unit 120. As noted above, the backplane 103 may include a thin film transistor substrate and a thin film transistor wiring layer.

Figure 7:
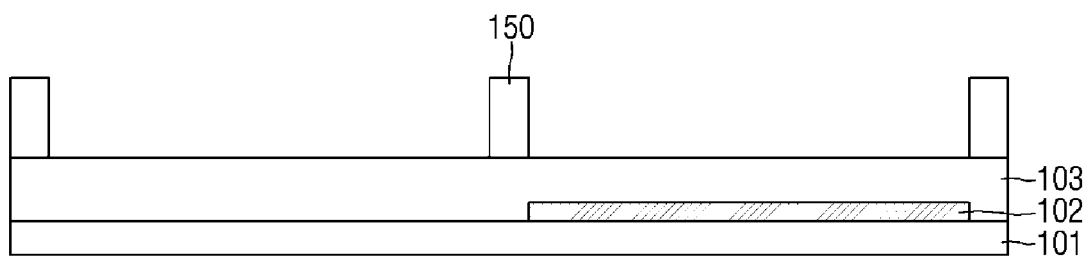

Referring to FIG. 7, the partition wall 150 may be formed between the first display unit 110 and the second display unit 120. Thus, the partition wall 150 may be used to define a separation boundary between the first sub-pixel unit SUB_PU1 and the second sub-pixel unit SUB_PU2, or between the first display unit 110 and the second display unit 120. Multiple partition walls 150 may be formed.

Figure 8:
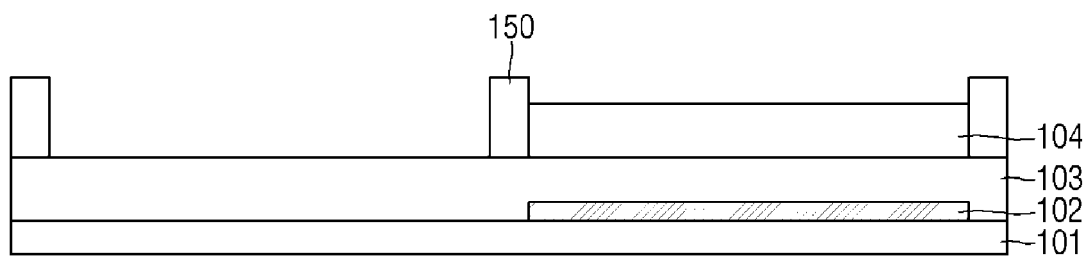

Referring to FIG. 8, the organic light emitting layer 104 may be formed in the second sub-pixel unit SUB_PU2 of the second display unit 120.

Figure 9:
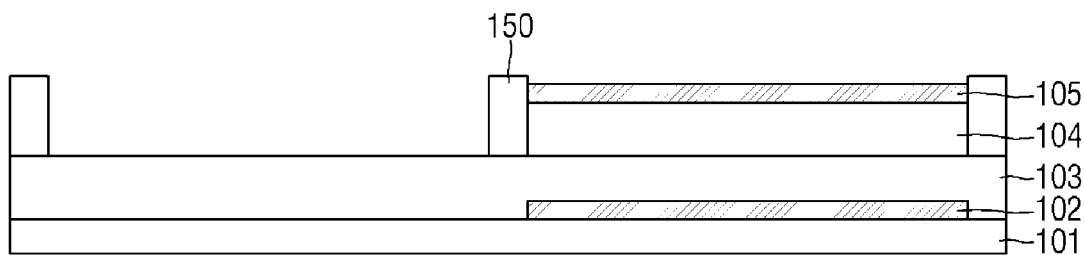

Referring to FIG. 9, the second electrode 105 may be formed above the organic light emitting layer 104. The second electrode 105 may function as an anode.

Figure 10:
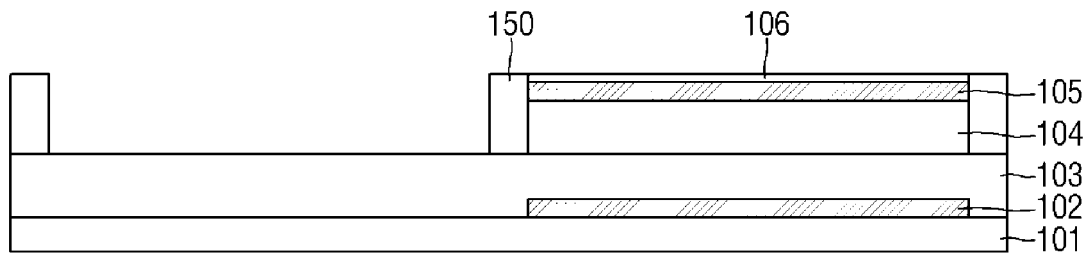

Referring to FIG. 10, the sealing layer 106 may be formed on the second electrode 105. In some embodiments, the sealing layer 106 may include a thin film encapsulation layer.

Figure 11:
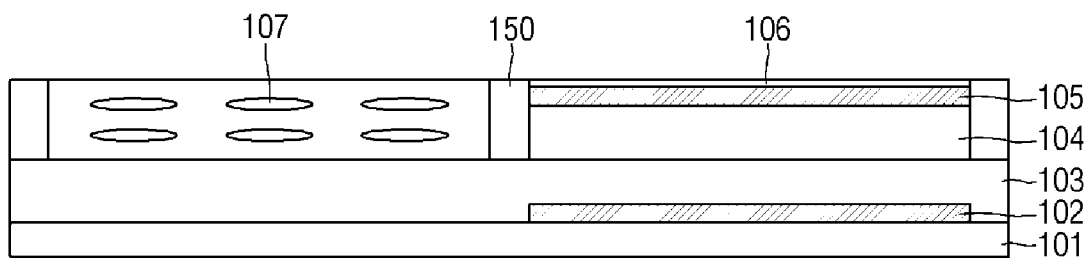

Referring to FIG. 11, the liquid crystal layer 107 may be formed on the backplane 103 of the first sub-pixel unit SUB_PU1.

Figure 12:
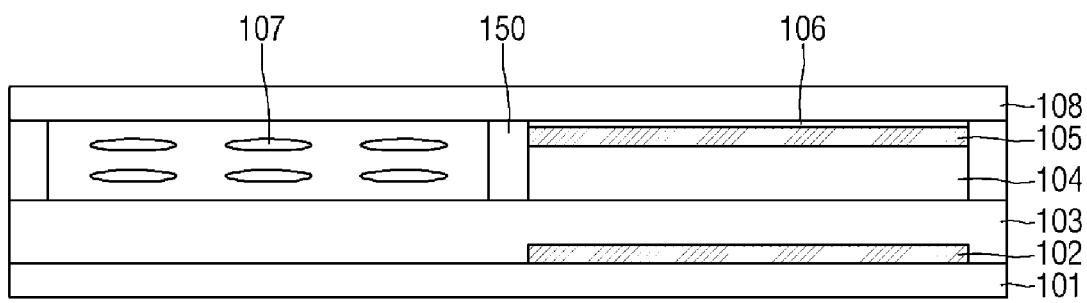

Referring to FIG. 12, the second substrate 108 may be formed on the first substrate 101 to cover the first display unit 110 and the second display unit 120.

Referring to FIG. 4, the polarizing film 109 may be formed on the second substrate 108 of the second display unit 120. Then, before the display driving circuit 1200 is attached to the display device 1100, it is possible to preliminarily test same. Once the display driving circuit 1200 is attached to the display device 1100, it is possible to test whether power is correctly supplied.

Figure 13:
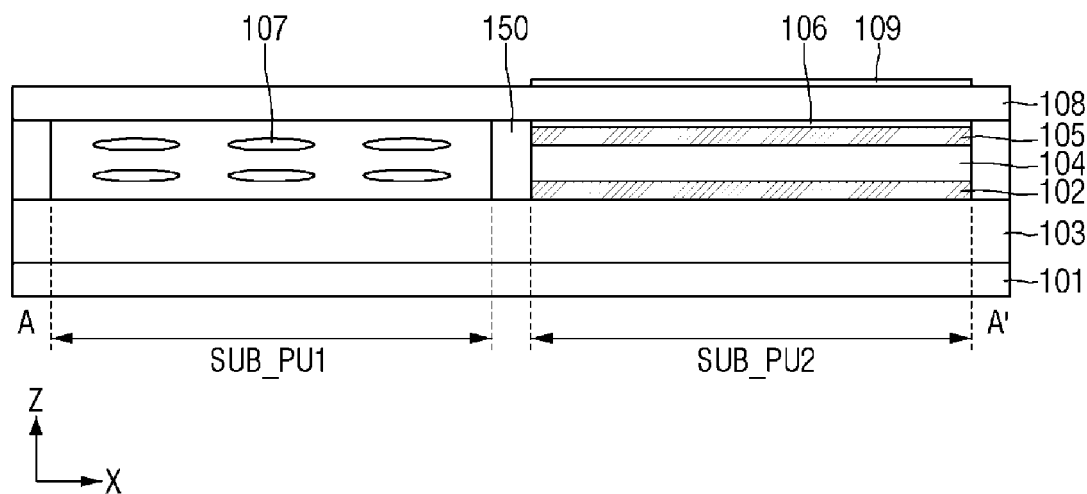
FIG. 13 is a cross-sectional view taken along line A-A' of FIG. 3 and related to another embodiment of the inventive concept.

FIG. 13 is another cross-sectional view illustrating a display device according to embodiments of this invention and may be compared with FIG. 4.

Referring to FIG. 13, the reflector 102 may be disposed between the first substrate 101 of the second display unit 120 and the organic light emitting layer 104. That is, the reflector 102 may be disposed between the backplane 103 and the organic light emitting layer 104. Once again, the reflector 102 is disposed only in the second display unit 120, and does not extend into the first display unit 110.

The backplane 103 may be directly disposed on the first substrate 101 in relation to both the first display unit 110 and the second display unit 120. Accordingly, the backplane 103 may be first formed on the first substrate 101, and may be integrally formed in both the first display unit 110 and the second display unit 120. The reflector 102 may then be formed on the backplane 103 in the second display unit 120.

Figure 14:
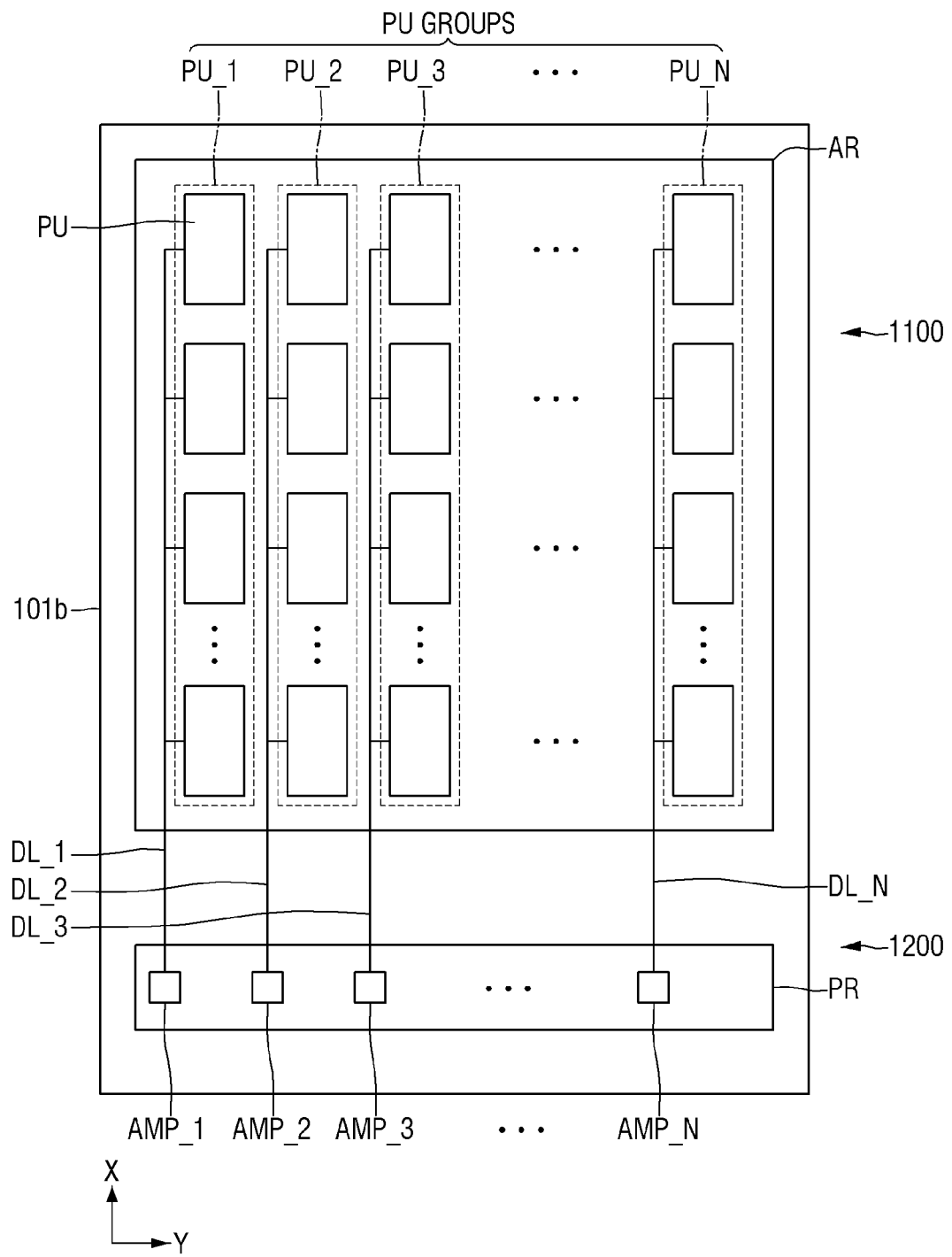
FIG. 14 is a plan diagram illustrating in one example a display device and a display driving circuit according to embodiments of the inventive concept.
Figure 15:
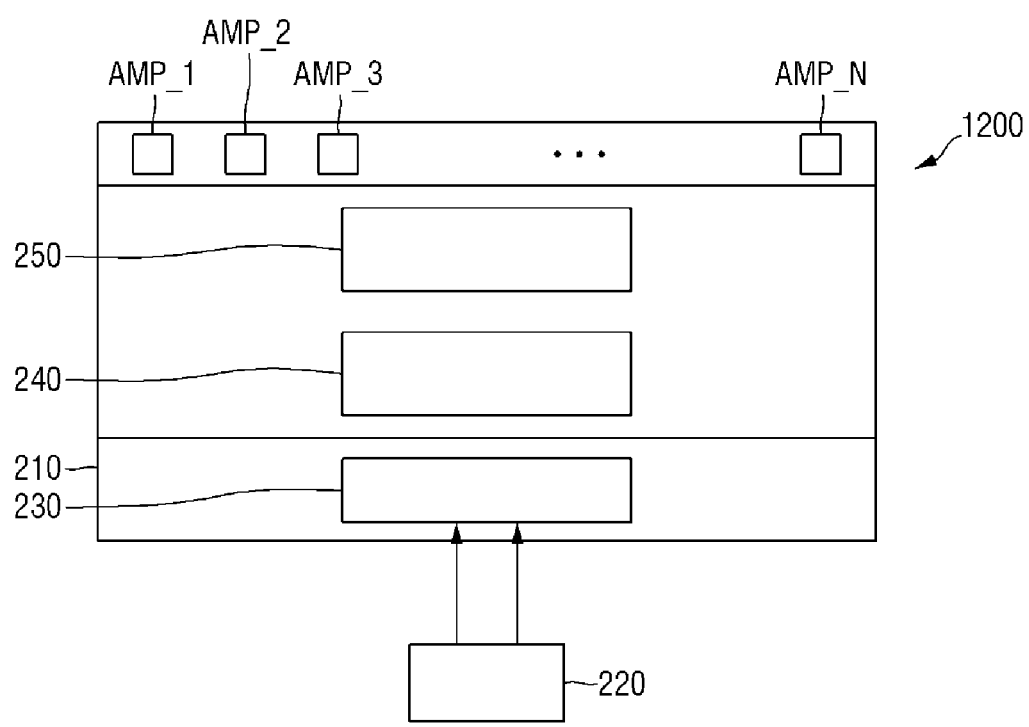
FIG. 15 is a plan diagram further illustrating in one example a display driving circuit according to embodiments of the inventive concept.

FIG. 14 is a plan diagram illustrating a display system 1000 including a display device 1100 and a display driving circuit 1200 according to embodiments of the inventive concept, and FIG. 15 is a plan diagram further illustrating the display driving circuit 1200 of FIG. 14.

Referring to FIG. 14, the display device 1100 is assumed to include first to Nth group pixel units (e.g., PU_1, PU_2, PU_3, . . . , PU_N) disposed in an active region AR, wherein the active region AR is spaced apart from a pad region PR in the first horizontal direction. Each pixel unit PU is further assumed to include a first display unit 110 and a second display unit 120, as described above.

The active region AR is a region in which images are displayed by the display system 1000. That is, the active region AR may generate visually-discernable images in response to signal(s) received from the pad region PR. For example, the active region AR may generate light through the internal organic light emitting layer 104 in response to an electrical signal transferred from the pad region PR. In this case, the organic light emitting layer 104 may emit light when holes and electrons are injected from the cathode and the anode. Further, for example, the display device 1100 may control the internal light emitting element according to the source signal and the gate signal provided from the display driving circuit 1200.

The pad region PR may be disposed in at least one edge region (e.g., top, bottom, left and/or right) surrounding the active region AR. As noted above, the pad region PR may be a region that transfers electrical signal(s) driving various elements within the active region AR. That is, the pad region PR may transfer signal(s) communicated from the display driving circuit 1200 to the active region AR.

The display system 1000 may further include gate lines (not shown in FIG. 14 to preserve clarity) connected to the gates of transistors for each of the pixel units PU, wherein the gate lines extend in a second horizontal direction (or 'Y' direction) intersecting the first horizontal direction. The display system 1000 may further include data lines DL_1, DL_2, DL_3, . . . , DL_N connected to sources of transistors for each of the pixel units PU, wherein the data lines extend in the first horizontal direction.

In some embodiments, source amplifiers AMP_1, AMP_2, AMP_3, AMP_N may be used to transfer data to the display device. The display driving circuit 1200 may include source amplifiers AMP_1, AMP_2, AMP_3, . . . , AMP_N that provide a source voltage to the first and second display units 110 and 120 and the first to Nth group pixel units PU_1, PU_2, PU_3, . . . , PU_N through the first to Nth data lines DL_1, DL_2, DL_3, . . . , DL_N.

For example, a first source amplifier AMP_1 among the source amplifiers may include a first_1 source amplifier and a first_2 source amplifier. In this case, the first_1 source amplifier of the first source amplifier AMP_1 may provide a source voltage to the first display unit 110 through the first data line DL_1, and the first_2 source amplifier of the first source amplifier AMP_1 may provide a source voltage to the second display unit 120 through the first data line DL_1.

In some embodiments, the first_1 and first_2 source amplifiers may be disposed alternately with each other. That is, each source amplifier that provides the source voltage to the first display unit 110 and the second display unit 120 that constitute the signal pixel unit may be disposed alternately with each other. Therefore, the display driving circuit 1200 may be electrically connected to both the first display unit 110 and the second display unit 120.

Referring to FIG. 15, the display driving circuit 1200 may include a power block 210, a High Speed Serial Interface (HSS I/F) 230, a logic block 240, and a gamma block 250.

The power block 210 may supply the power (e.g., at least one power signal, such as VDD, VSS ground, etc.) to the first and second electrodes 102 and 105. The power block 210 may receive one or more external power signals. In some embodiments, the power block 210 may include first and second power blocks that respectively supply power to the first display unit 110 and the second display unit 120.

The HSS I/F 230 may serially send and receive the data from the AP 220. Accordingly, the HSS IF 230 may transfer the data to the logic block 240 at relatively high speed. In this regard, the HSS I/F 230 may be used to series transfer data to the first display unit 110 and the second display unit 120.

The logic block 240 may be used to process data relating to colors and other display features, as received from the AP 220, and then transfer the data to the gamma block 250. Here, the logic block 240 may include first and second logic blocks that may respectively transfer data to the first display unit 110 and the second display unit 120.

In this regard, the gamma block 250 may receive data relating to the colors and other features and provide voltage(s) corresponding to the data. For example, the gamma block 250 may receive data relating to a density difference (gradation) of color and provide voltages differently depending on the density of color, however the inventive concept is not limited thereto. The gamma block 250 may include first and second gamma blocks that respective provide voltages that vary with the data to the first display unit 110 and the second display 120.

Figure 16:
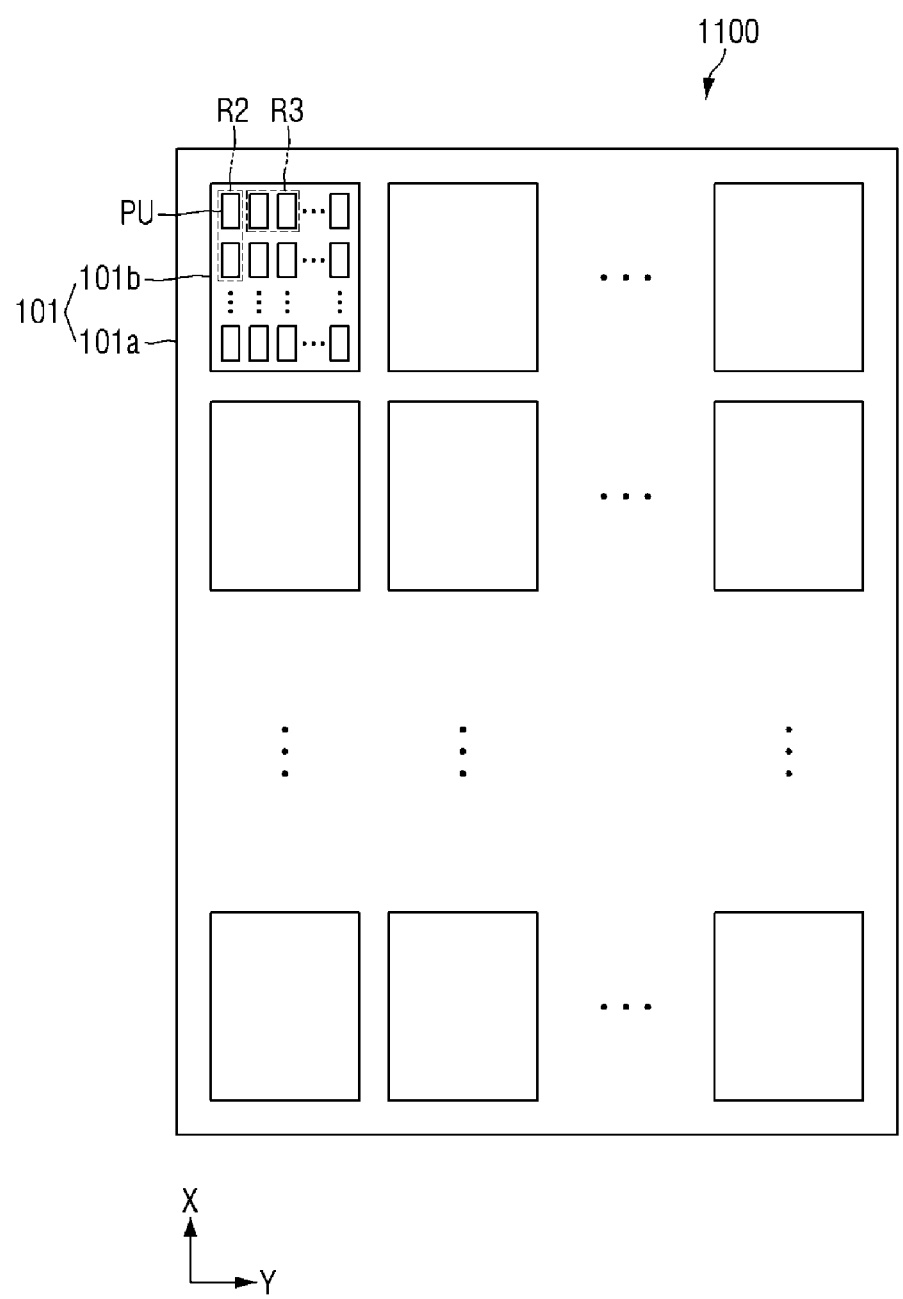
FIG. 16 is a plan diagram illustrating in another example a display device according to embodiments of the inventive concept.
Figure 17:
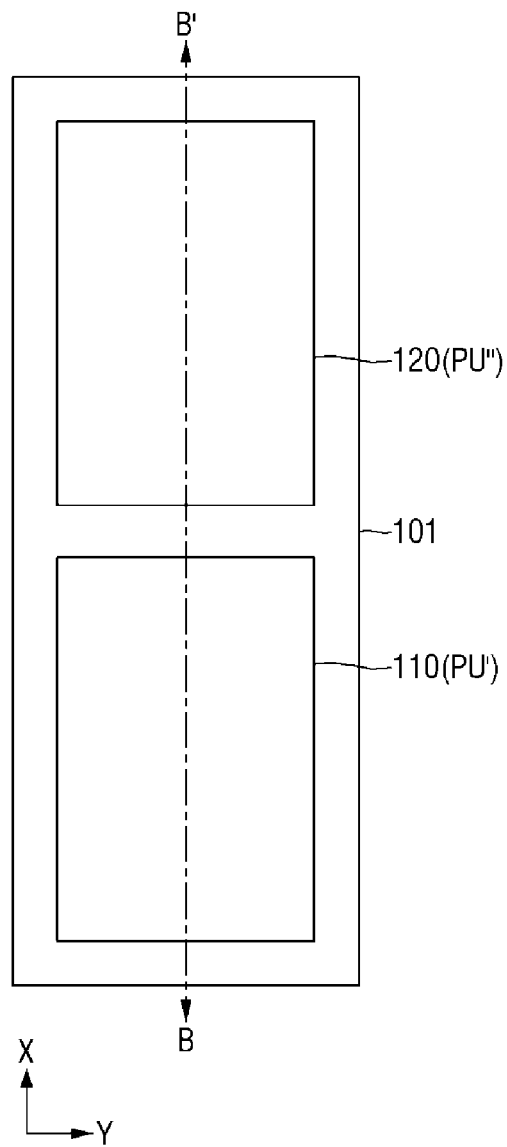
FIG. 17 is an enlarged view of region 'R2' indicated in FIG. 16.
Figure 18:
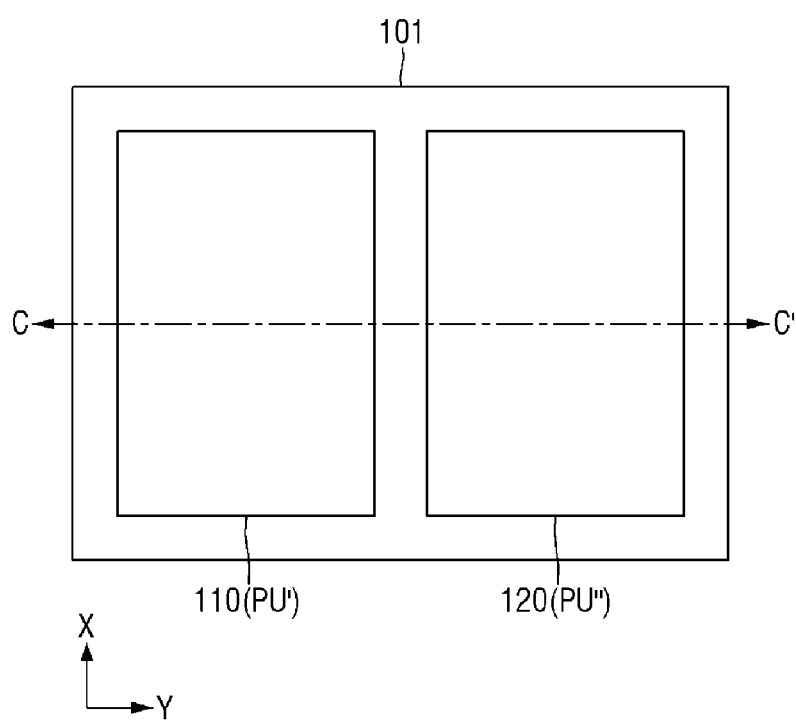
FIG. 18 is an enlarged view of region 'R3' indicated in FIG. 16.
Figure 19:
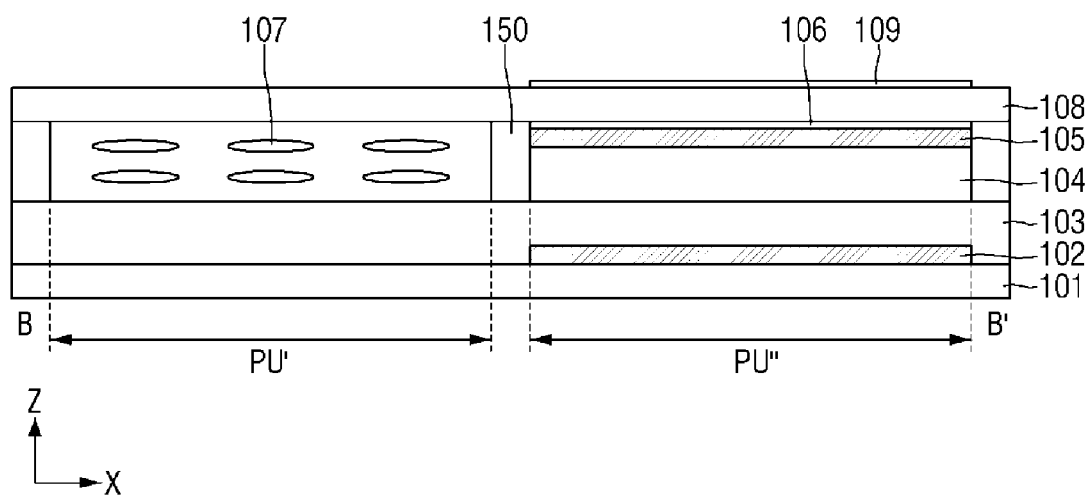
FIG. 19 is a cross-sectional view taken along line B-B' of FIG. 17.
Figure 20:
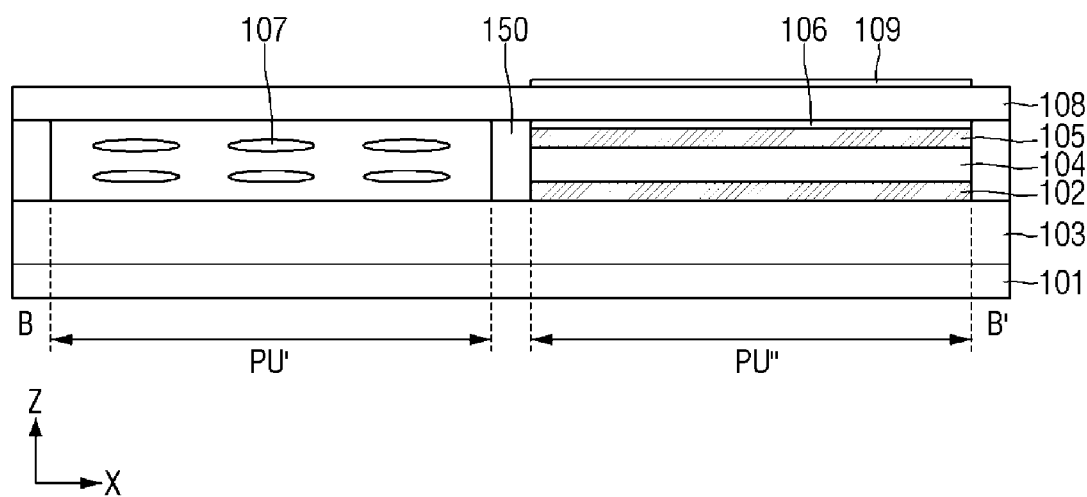
FIG. 20 is a cross-sectional view illustrating a display device according to embodiments of this inventive concept, as taken along the line B-B' of FIG. 17.

FIG. 16 is a plan diagram illustrating a display device 1100 according to embodiments of the inventive concept, FIG. 17 is an enlarged view of region 'R2' indicated in FIG. 16, FIG. 18 is an enlarged view of region 'R3' indicated in FIG. 16, FIG. 19 is a cross-sectional view taken along a line B-B' of FIG. 17, and FIG. 20 is a cross-sectional view and may be compared with FIG. 19.

Referring to FIGS. 16, 17 and 18, each pixel unit PU may include a first display unit 110 (or PU') and a second display unit 120 (or PU"). The first display unit 110 and the second display unit 120 may be alternately disposed on the panel substrate 101b in the first horizontal direction (e.g., the X direction) (see. e.g., FIG. 17), or in the second horizontal direction (e.g., the Y direction) (see, e.g., FIG. 18).

The illustrated embodiment of FIG. 19 may be compared with the embodiment of FIG. 4, exchanging the first sub-pixel unit and second sub-pixel units (SUB_PU1 and SUB_PU2) for the first pixel unit PU' and the second pixel unit PU". Similarly, the illustrated embodiment of FIG. 20 may be compared with the embodiment of FIG. 13, exchanging the first sub-pixel unit and second sub-pixel units (SUB_PU1 and SUB_PU2) for the first pixel unit PU' and the second pixel unit PU".

Further in this regard, a cross section taken along line C-C' of FIG. 18 may be compared with the illustrated embodiment of FIG. 4, except that the regions in which the first display unit 110 and the second display unit 120 may be indicated as first pixel unit (PU') and the second pixel unit (PU") instead of the first sub-pixel unit (SUB_PU1) and the second sub-pixel unit (SUB_PU2).

In some embodiments, the display driving circuit 1200 may include source amplifiers AMP_1, AMP_2, AMP_3, . . . , AMP_N that respectively provide source voltages to the first display unit 110 and the second display unit 120 of the first to Nth group pixel units (e.g., PU_1, PU_2, PU_3, . . . , PU_N through the first to Nth data lines DL_1, DL_1, DL_3, . . . , DL_N). (See, e.g., FIG. 14). Thus, by way of exemplary explanation, a first source amplifier AMP_1 may provide a source voltage to the first display unit 110 through the first data line DL_1, and a second source amplifier AMP_1 may provide a source voltage to the second display unit 120 through the second data line DL_2, and so forth.

As previously noted, in some embodiments, the first source amplifiers and the second source amplifiers may be alternately disposed in relation to one another. That is, the first source amplifier AMP_1 and the second source amplifiers AMP_2 respectively providing source voltages to the first display unit 110 and the second display unit 120 (i.e., respective pixel units) may be alternately disposed. In this manner, the display driving circuit 1200 may be electrically connected to both the first display unit 110 and the second display unit 120.

Figure 21:
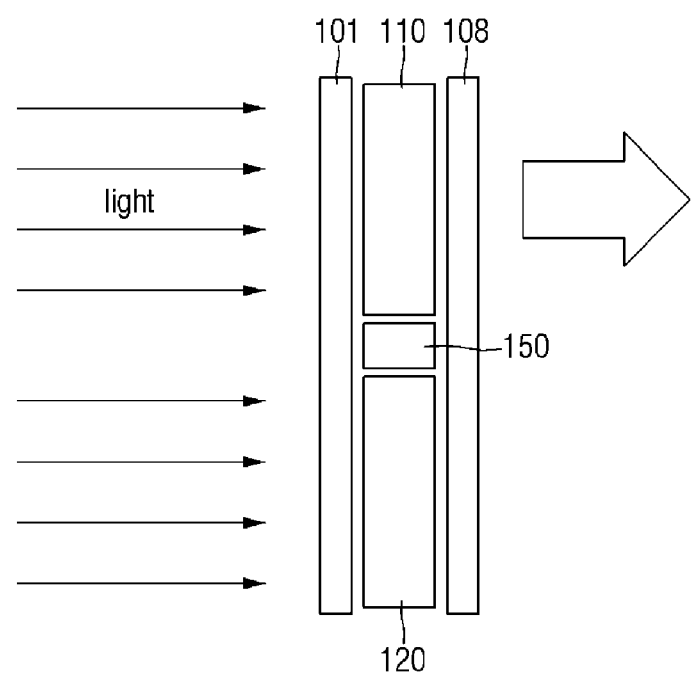
FIGS. 21 and 22 are respective block diagrams illustrating a display method that may be used in relation to a display device according to embodiments of the inventive concept.
Figure 22:
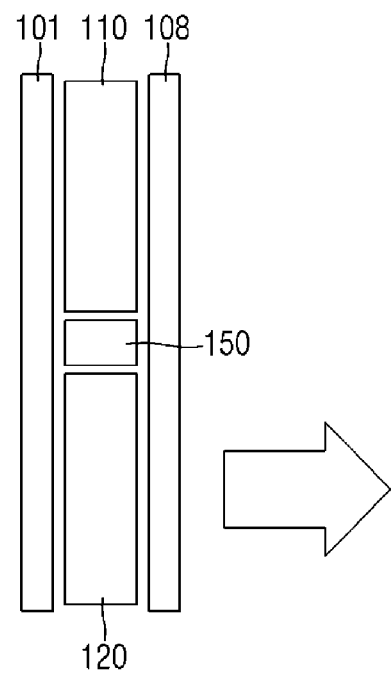

FIGS. 21 and 22 are respective diagrams illustrating operation of the a display panel according to embodiments of the inventive concept.

Referring to FIGS. 21, the liquid crystal layer 107 may be controlled to drive the first display unit 110 in a high ambient light (e.g., relatively bright) environment. However, as illustrated in FIG. 22, in a low ambient light environment, the liquid crystal layer 107 may be insufficiently driven for clear user viewing, and so the second display unit 120 may be driven.

When a display system, like the display systems described above, is used for at least part of a front windshield or at least part of a side window of a vehicle, or is used for as at least part of a window in a building, for example, it is possible for the display system to more flexibly respond to variations in ambient lighting. That is, consistent with embodiments of the inventive concept, constituent pixel units may include the first display unit 110 including the liquid crystal layer 107, as well as the second display unit 120 including the organic light emitting layer 104. Accordingly, it is possible to implement a display device that more flexibly responds to changing in lightening of an external environment by differentially driving different types of display units for each pixel unit PU.

Those skilled in the art will appreciate that many variations and modifications may be made to the illustrated embodiments without substantially departing from the scope of the inventive concept, as defined by the following claims.

What is claimed is:

1. A display device comprising:
   a first substrate; and
   pixel units arranged in a matrix on the first substrate,
   wherein each pixel unit among the pixel units includes a transmission region including a liquid crystal layer, and a reflection region spaced apart from the transmission region and including an organic light emitting layer,
   wherein in first pixel units from among the pixel units the transmission region is spaced apart from the reflection region in a first horizontal direction, and in second pixel units from among the pixel units the transmission region is spaced apart from the reflection region in a second horizontal direction that intersects the first horizontal direction.

2. The display device of claim 1, wherein the reflection region includes a reflector extending between the first substrate and the organic light emitting layer.

3. The display device of claim 2, further comprising:
   a polarizing film disposed on the reflection region over the reflector.

4. The display device of claim 2, wherein the reflector does not extend into the transmission region.

5. The display device of claim 2, wherein the reflection region further includes an electrode disposed on the organic light emitting layer, and
   the organic light emitting layer is disposed between the reflector and the electrode.

6. The display device of claim 2, further comprising:
   a partition wall disposed between the transmission region and the reflection region.

7. The display device of claim 6, wherein the reflection region further includes an electrode disposed on the organic light emitting layer, and a sealing layer disposed on the electrode, and the display device further includes a second substrate formed on an upper surface of the transmission region and on an upper surface of the reflection region.

8. The display device of claim 1, further comprising:

a backplane extending under the reflection region and the transmission region, wherein the backplane includes a thin film transistor substrate and a thin film transistor wiring layer.

9. The display device of claim 1, wherein the display device is a display panel including an active region and a pad region spaced apart from the active region, the pixel units are disposed in the active region, and the display device further includes a display driving circuit disposed in the pad region and configured to provide an electrical signal to drive the display panel.

10. The display device of claim 9, wherein display driving circuit includes a first source amplifier providing a first source voltage to the transmission region, and a second source amplifier providing a second source voltage to the reflection region.

11. The display device of claim 10, wherein the reflection region includes a reflector extending between the first substrate and the organic light emitting layer and an electrode on the organic light emitting layer, and the display driving circuit further includes a power block providing at least one power signal to the reflector and the electrode, and a high speed serial interface serially communicating data to at least one pixel unit among the pixel units.

12. A display system comprising:

a display panel including pixel units disposed on a first substrate; and a driving circuit providing a driving signal to the display panel, wherein each pixel unit among the pixel units includes a transmission region including a liquid crystal layer, and a reflection region spaced apart from the transmission region and including an organic light emitting layer, and wherein the driving circuit includes a first source amplifier providing a first source voltage to the transmission region through a first data line, and a second source amplifier alternately disposed in relation to the first source amplifier and providing a second source voltage to the reflection region through the first data line.

13. The display system of claim 12, wherein the reflection region further includes a first electrode disposed between the first substrate and the organic light emitting layer, and a second electrode disposed on an upper surface of the organic light emitting layer.

14. The display system of claim 12, wherein each of the reflection region and the transmission region further includes a backplane, and the backplane includes a thin film transistor substrate and a thin film transistor wiring layer.

15. The display system of claim 12, further comprising:

a partition wall defining a separation boundary between the transmission region and the reflection region.

16. A display system comprising:

a display panel including a substrate and pixel units disposed on the substrate; and a display driving circuit providing at least one driving signal to the pixel units, wherein each pixel unit among the pixel units includes a backplane, a first display unit including a liquid crystal layer, and a second display unit, spaced apart from form the first display unit, and including an organic light emitting layer and a first electrode, wherein the first electrode does not extend into the first display unit, and wherein the backplane is disposed under the organic light emitting layer, and the first electrode is disposed on a lower surface of the backplane with the backplane between the organic light emitting layer and the first electrode.

17. The display system of claim 16, wherein the second display unit further comprises:

a second electrode disposed on the organic light emitting layer;

a sealing layer disposed on the second electrode; and a second substrate disposed on the sealing layer.

18. The display system of claim 17, wherein the display driving circuit provides the at least one driving signal to at least one of the first electrode and the second electrode.

* * * * *